United States Patent
Lang et al.

(10) Patent No.: US 9,741,965 B2
(45) Date of Patent: Aug. 22, 2017

(54) METHOD FOR PROCESSING AN ELECTRONIC COMPONENT AND ELECTRONIC COMPONENT ARRANGEMENT

(71) Applicant: OSRAM OLED GmbH, Regensburg (DE)

(72) Inventors: Erwin Lang, Regensburg (DE); Philipp Schwamb, Regensburg (DE); Simon Schicktanz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/901,110

(22) PCT Filed: Jun. 13, 2014

(86) PCT No.: PCT/EP2014/062449
§ 371 (c)(1),
(2) Date: Dec. 28, 2015

(87) PCT Pub. No.: WO2014/206775
PCT Pub. Date: Dec. 31, 2014

(65) Prior Publication Data
US 2016/0149158 A1    May 26, 2016

(30) Foreign Application Priority Data
Jun. 25, 2013  (DE) .................. 10 2013 106 631

(51) Int. Cl.
*H01L 51/52*  (2006.01)
*H01L 51/00*  (2006.01)
(Continued)

(52) U.S. Cl.
CPC ...... *H01L 51/5253* (2013.01); *H01L 27/3272* (2013.01); *H01L 51/0097* (2013.01);
(Continued)

(58) Field of Classification Search
CPC . H01L 51/56; H01L 51/5253; H01L 51/0097; H01L 51/5246; H01L 27/3272;
(Continued)

(56) References Cited

U.S. PATENT DOCUMENTS

2006/0286718 A1   12/2006  Ozaki
2009/0128030 A1   5/2009   Kai et al.
(Continued)

FOREIGN PATENT DOCUMENTS

CN  101960916 A   1/2011
DE  20215401 U1   2/2004
(Continued)

OTHER PUBLICATIONS

Chinese Office Action based on application No. 201480036806.4 (9 pages and 7 pages of English translation) dated Aug. 31, 2016 (Reference Purpose Only).
(Continued)

*Primary Examiner* — Caridad Everhart
(74) *Attorney, Agent, or Firm* — Viering, Jentschura & Partner mbB

(57) ABSTRACT

Various embodiments may relate to a method for processing an electronic component. The method includes applying a planar structure provided with predetermined separation locations to the electronic component, and removing a part of the applied planar structure, wherein removing includes separating the planar structure at the predetermined separation locations.

14 Claims, 7 Drawing Sheets

(51) Int. Cl.
*H01L 51/56* (2006.01)
*H01L 27/32* (2006.01)

(52) U.S. Cl.
CPC ............ *H01L 51/52* (2013.01); *H01L 51/524* (2013.01); *H01L 51/529* (2013.01); *H01L 51/5243* (2013.01); *H01L 51/5246* (2013.01); *H01L 51/5284* (2013.01); *H01L 51/56* (2013.01); *H01L 2251/5338* (2013.01); *H01L 2251/566* (2013.01)

(58) Field of Classification Search
CPC ....... H01L 2251/566; H01L 2251/5339; H01L 51/524; H01L 51/5243; H01L 51/529; H01L 51/52
See application file for complete search history.

(56) References Cited

U.S. PATENT DOCUMENTS

| | | |
|---|---|---|
| 2011/0070456 A1 | 3/2011 | Philippens et al. |
| 2014/0127480 A1 | 5/2014 | Masuda |
| 2014/0318690 A1* | 10/2014 | Moon ................ G02F 1/1333 156/182 |

FOREIGN PATENT DOCUMENTS

| | | |
|---|---|---|
| DE | 10323301 A1 | 4/2004 |
| DE | 102008031533 A1 | 1/2010 |
| JP | 2006331905 A | 12/2006 |
| JP | 2007234331 A | 9/2007 |
| WO | 2009110067 A1 | 9/2009 |
| WO | 2012164612 A1 | 12/2012 |

OTHER PUBLICATIONS

International Search Report based on application No. PCT/EP2014/062449 (4 pages and 3 Pages of English translation) dated Oct. 14, 2014 (for reference purpose only).
German Search Report based on application No. 10 2013 106 631.3(5 pages) dated Apr. 17, 2014 (for reference purpose only).
German Search Report based on application No. 10 2013 106 631.3 (6 pages) dated Dec. 16, 2016 (for reference purpose only).

* cited by examiner

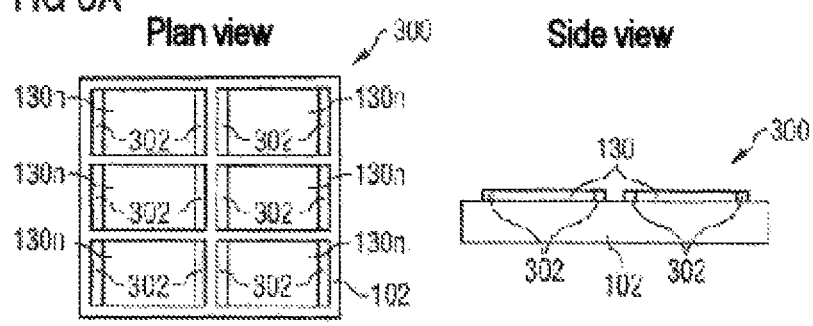
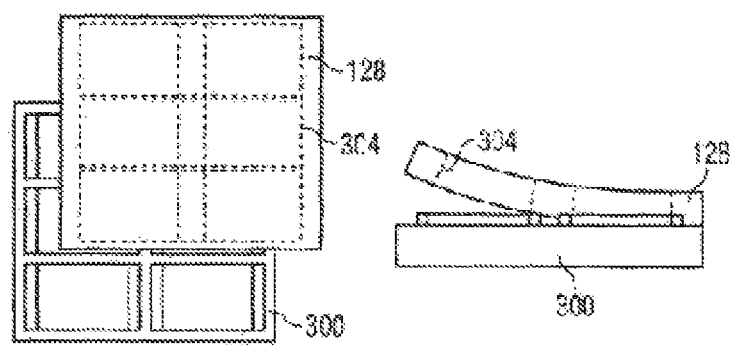
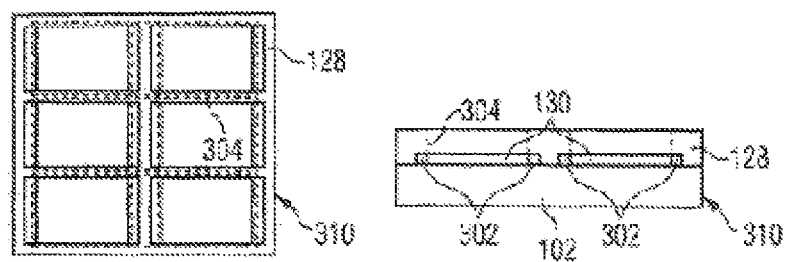

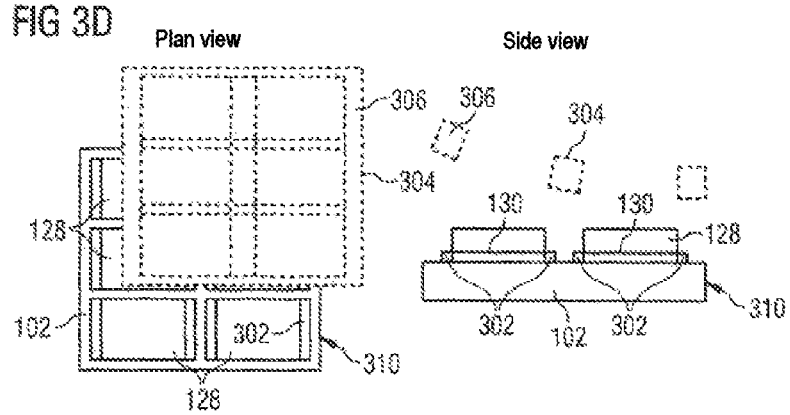
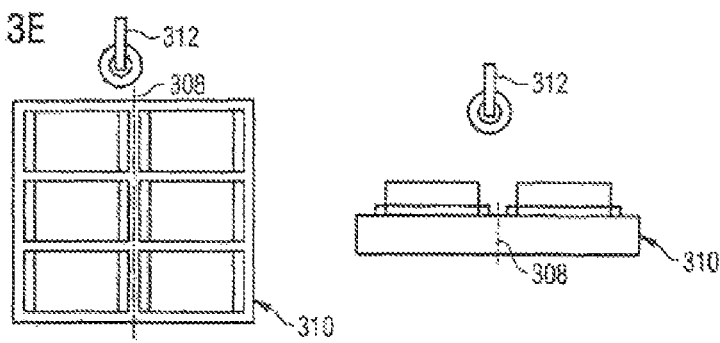
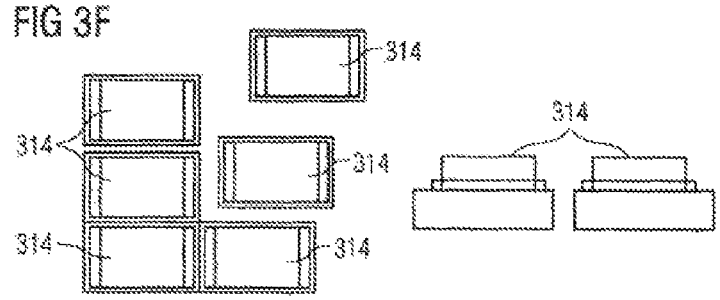

METHOD FOR PROCESSING AN ELECTRONIC COMPONENT AND ELECTRONIC COMPONENT ARRANGEMENT

RELATED APPLICATIONS

The present application is a national stage entry according to 35 U.S.C. §371 of PCT application No. PCT/EP2014/062449 filed on Jun. 13, 2014 which claims priority from German application No. 10 2013 106 631.3 filed on Jun. 25, 2013, and is incorporated herein by reference in its entirety.

TECHNICAL FIELD

In various embodiments, a method for processing an electronic component and an electronic component arrangement are provided.

BACKGROUND

Optoelectronic components on an organic basis, for example an organic light emitting diode (OLED), are being increasingly widely used in general lighting. An organic optoelectronic component, for example an OLED, conventionally includes on a carrier an anode and a cathode with an organic functional layer system therebetween. The organic functional layer system may include for example one or a plurality of emitter layer(s) in which electromagnetic radiation is generated, one or a plurality of charge generating layer structure(s) each composed of two or more charge generating layers (CGL) for charge generation, and one or a plurality of electron blocking layer(s), also designated as hole transport layer(s) (HTL), and one or a plurality of hole blocking layer(s), also designated as electron transport layer(s) (ETL), in order to direct the current flow.

Conventional carriers of organic light emitting diodes are glass substrates that are adhesively bonded with a cavity glass on the rear side. A getter can be adhesively bonded in the cavity glass in order to bind moisture penetrating through the adhesive connection. In further conventional carriers, a thin-film encapsulation is formed on the rear side of the glass substrate, wherein a further glass as anti-scratch protection is laminated onto the rear side of the OLED. Both types of carriers for OLEDs can conventionally be singulated from the plate level to form individual devices by means of a scribe and break installation. This is carried out by a procedure in which the glass substrate is correspondingly scribed at the front side and at the rear side and subsequently broken by means of a "scribe wheel" with a specific force at corresponding breaking or singulating edges or singulating lines.

In conventional methods, a plastics film as anti-scratch protection or a metal film is laminated on the rear side of the carrier over the whole area. Such a substrate including carrier and laminated film each including different materials is also referred to as a hybrid OLED. A conventional method for singulation no longer functions in the case of a hybrid OLED since glass and plastics films or metal films cannot be singulated simultaneously by means of a scribe wheel. A plastics film as "elastic material" yields or springs back during scribing, for example, with the result that the plastics film is not actually separated at the scribed location.

In one conventional method, different materials are separated in one process by means of a laser. In the case of an OLED between a glass substrate and a cover glass, the contact areas of the OLED are conventionally exposed. At corresponding high laser powers or in specific wavelength ranges, the separation process is not selective between the glass substrate and the cover glass on the glass substrate. This makes it more difficult to cut the glass substrate and/or the cover glass at the front and/or rear side at different positions for exposing the contact areas. Moreover, this method requires the procurement of an expensive and usually also very cost-intensive maintenance of a laser system.

In a further conventional method, metal films which are intended to be applied to the OLED are trimmed to the OLED individual devices and shape prior to lamination thereon and are subsequently adhesively bonded/laminated individually onto the OLEDs at the corresponding positions of the carrier. Such a method is carried out sequentially and, as a manual process, is greatly affected by defects regarding quality and alignment of the individual film pieces. Furthermore, particles can increasingly be incorporated between film and OLED during the processing of individual film pieces. As a result, the individual processing of film pieces increases the risk of short circuits and the risk of damage to the (thin-film) encapsulation of the OLED. Individual application of film pieces is therefore not suitable for mass production.

SUMMARY

In various embodiments, a method for processing an electronic component and an electronic component arrangement are provided which make it possible to singulate hybrid carriers of electronic components, for example of an organic light emitting diode, in a simple manner and with conventional/existing methods. Furthermore, it is thereby possible to expose contact areas on hybrid carriers of electronic components more simply. Furthermore, it is thereby possible to singulate optoelectronic components which include a glass substrate and a cover glass and in which a coupling-in/-out scattering film is applied over the whole area on the front side as early as at the plate level, for example in the case of OLEDs.

In various embodiments, a method for processing an electronic component is provided, the method including: applying a planar structure provided with predetermined separation locations to the electronic component; and removing a part of the applied planar structure, within removing includes separating the planar structure at the predetermined separation locations.

In one configuration of the method, the planar structure can be formed in a flexible fashion, for example in a mechanically flexible fashion, for example in a reversibly bendable fashion.

In one configuration of the method, the planar structure may include or be a film, for example a metal film, a plastics film or a thin glass.

In one configuration of the method, the planar structure can be formed in such a way that it has one of the following effects: heat conduction; scattering, reflection, filtering and/or absorption of electromagnetic radiation; guiding of electromagnetic radiation, for example as waveguide and/or optical cavity; barrier effect with respect to substances and fields that damage the electronic component, for example as protection against water, oxygen, UV radiation; coupling-out or coupling-in of electromagnetic radiation from/into the electronic component; alteration of the optical appearance of the electronic component, for example as high-gloss coating; and/or mechanical protection for example with respect to scratching, striking, bending of the electronic component.

In one configuration of the method, the planar structure can be formed in a self-adhesive fashion. As a result, the electronic component can be closely fixed to a surface by means of the planar structure. Closely connecting and closely fixing are understood to mean forming a close connection, that is to say a cohesive, positively locking and/or force-locking connection. A close connection means is the means or medium by means of which a close connection is formed between a first body and a second body, for example an adhesive or a clip.

In one configuration of the method, the planar structure can have a thickness in a range of approximately 10 μm to approximately 500 μm.

In one configuration of the method, the electronic component may include an optoelectronic component.

In one configuration of the method, the optoelectronic component may include an organic light emitting diode.

In one configuration of the method, the optoelectronic component may include a solar cell and/or a photodetector.

In one configuration of the method, the electronic component may include two or more electronic component units, wherein the planar structure is applied on or above the two or more electronic component units.

In one configuration of the method, at least one predetermined separation location can be formed between two electronic component units.

In one configuration of the method, the removed part of the applied planar structure can be removed from a singulation region between the two electronic component units.

In one configuration of the method, the electronic component may include an electrical contact region, wherein the removed path of the applied planar structure is removed from the electrical contact region.

In one configuration of the method, removing furthermore may include pulling off the part to be removed of the applied planar structure from the optoelectronic component. The part to be removed can be pulled off in one piece, for example.

In one configuration of the method, the electronic component can be formed on a carrier, wherein a planar structure is applied on or above the electronic component, and/or wherein a planar structure is applied on or above that side of the carrier which faces away from the electronic component.

In one configuration of the method, applying the planar structure may include cohesively connecting the planar structure to the electronic component.

In one configuration of the method, the cohesive connection can be formed by means of: a double-sided adhesive tape; a liquid adhesive; a UV-curable adhesive and/or a pressure-sensitive adhesive.

In one configuration of the method, the planar structure can be laminated onto the electronic component.

In one configuration of the method, the means for forming the cohesive connection can be applied in a structured fashion on or above the electronic component and/or the planar structure or is structured after the applying process.

In one configuration of the method, the region between the part to be removed of the planar structure and the electronic component can remain free of close connection means.

In one configuration of the method, the means for forming the cohesive connection can have a lower adhesion and/or cohesion between the part to be removed of the planar structure and the electronic component compared with in the region between the planar structure not to be removed and the electronic component.

In one configuration of the method, the carrier and the planar structure can differ in at least one of the following properties: the chemical resistance with respect to an acid, a base or a solvent; the mechanical deformation resistance with respect to a singulation method. Singulation of the electronic component including a planar structure can be carried out by means of a physical method, for example water jet cutting, or plasma cutting; a mechanical method, for example sawing; an optical method, for example laser ablation; a chemical method, for example dissolution or etching; and/or a combination of these methods, for example chemical mechanical polishing. However, the planar structure and the carrier of the electronic component can have different sensitivities with respect to said methods on account of their properties. By way of example, the carrier can be singulated by one of the methods mentioned, wherein the planar structure is insensitive for this method in the region without a predetermined separation location, i.e. is not divided.

In one configuration of the method, the predetermined separation location and the planar structure can differ in at least one of the following properties: the chemical resistance with respect to an acid, a base or a solvent; the mechanical deformation resistance with respect to a singulation method.

In one configuration of the method, the carrier and the planar structure may include a different material.

In one configuration of the method, the carrier and the planar structure may include the same material, but be formed differently. By means of different production methods, materially identical structures can differ in physical properties, for example have a different density or crystallinity. As a result, the planar structure and the carrier can be processed, for example divided, in different ways.

In various embodiments, an electronic component arrangement is provided, the electronic component arrangement including: an electronic component on a carrier; and a planar structure, wherein the planar structure includes a planar structure on the carrier and/or a planar structure on the electronic component, and wherein the planar structure includes predetermined separation locations, wherein the planar structure is formed in such a way that a part of the planar structure is removable from the electronic component arrangement after a process of separating the predetermined separation locations.

In one configuration, the planar structure can be formed in a flexible fashion, for example in a mechanically flexible fashion, for example in a reversibly bendable fashion.

In one configuration, the planar structure may include or be a film.

In one configuration, the planar structure can be formed in such a way that it has one of the following effects: heat conduction; scattering, reflection, filtering and/or absorption of electromagnetic radiation; guiding of electromagnetic radiation, for example as waveguide and/or optical cavity; barrier effect with respect to substances and fields that damage the electronic component, for example as protection against water, oxygen, UV radiation; coupling-out or coupling-in of electromagnetic radiation from/into the electronic component; alteration of the optical appearance of the electronic component, for example as high-gloss coating; and/or mechanical protection for example with respect to scratching, striking, bending of the electronic component.

In one configuration, the predetermined separation location and the planar structure can differ in at least one of the following properties: the chemical resistance with respect to an acid, a base or a solvent; the mechanical deformation resistance with respect to a singulation method.

In one configuration, the means for forming the cohesive connection can have a lower adhesion and/or cohesion between the part to be removed of the planar structure and the electronic component compared with in the region between the planar structure not to be removed and the electronic component.

In one configuration, the planar structure can have a thickness in a range of approximately 10 µm to approximately 500 µm.

In one configuration, the electronic component may include an optoelectronic component.

In one configuration, the optoelectronic component may include an organic light emitting diode.

In one configuration, the optoelectronic component may include a solar cell and/or a photodetector.

In one configuration, the electronic component may include two or more electronic component units, wherein the planar structure is formed on or above the two or more electronic component units.

In one configuration, at least one predetermined separation location can be formed between two electronic component units.

In one configuration, the removable part of the applied planar structure can be formed above a singulation region between the two electronic component units. By means of separating the predetermined separation locations, it is already possible to reduce the resistance of the electronic component with respect to the singulation of the electronic component units in the region of the separated predetermined separation location, for example by virtue of the fact that the planar structure need no longer be severed during the singulation of the electronic component units.

With two or more predetermined separation locations between two electronic component units, it is possible to form between the two electronic component units a region which is free of planar structure after removal of the part of the planar structure between said predetermined separation locations. It is thereby possible to simplify and/or facilitate singulation of the component units in said region.

In one configuration, the electronic component may include an electrical contact region, wherein the removable part of the applied planar structure is formed above the electrical contact region.

In one configuration, the planar structure can be formed in such a way that the removable part of the planar structure is formed such that it is removable in one piece.

In one configuration, the planar structure can be cohesively connected to the electronic component.

In one configuration, the cohesive connection can be formed by means of: a double-sided adhesive tape; a liquid adhesive; a UV-curable adhesive and/or a pressure-sensitive adhesive.

In one configuration, the planar structure can be laminated onto the electronic component.

In one configuration, the means for forming the cohesive connection can be formed in a structured fashion on or above the electronic component and/or the planar structure.

In one configuration, the region between the part to be removed of the planar structure and the electronic component can be free of cohesive connection means.

In one configuration, the carrier and the planar structure can differ in at least one of the following properties: the chemical resistance with respect to an acid, a base or a solvent, the mechanical deformation resistance with respect to a singulation method.

In one configuration, the carrier and the planar structure may include a different material.

In one configuration, the carrier and the planar structure may include the same material, but be formed differently.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 3A-3F show schematic illustrations of optoelectronic component arrangements in the method for processing in accordance with various embodiments;

DETAILED DESCRIPTION

Figure 1:
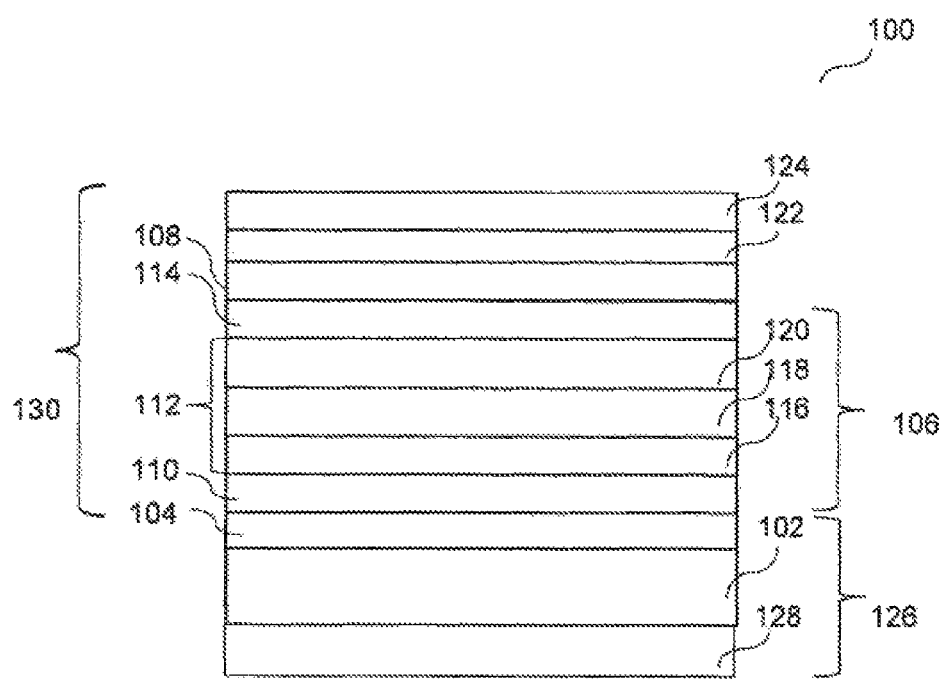
FIG. 1 shows a schematic cross-sectional view of an electronic component arrangement including a planar structure in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In the case of an electronic component including a plurality of electronic component units, the term electronic component is used when considering an individual electronic component unit.

A predetermined separation location is a region of a structure which has a lower resistance with respect to a separation method than at least the regions of the structure which adjoin the predetermined separation location. The configuration of the predetermined separation location can be dependent on the method used for separating the predetermined separation location.

In the case of a mechanical method for separating the predetermined separation location, the predetermined separation location can have a lower mechanical resistance than the regions of the structure which adjoin the predetermined separation location. A lower mechanical resistance can be formed by virtue of the predetermined separation location being formed from a different material and/or by a different method in such a way that the predetermined separation location has a lower hardness. In addition or instead, the predetermined separation location can be structured, for example have a cutout, cavities or perforations. As a result, that proportion of material which is removable in the predetermined separation location can be reduced, as a result of which the mechanical resistance is reduced.

In the case of a chemical method for separating, the predetermined separation location can have a higher solubility than the regions of the structure which adjoin the predetermined separation location. A higher chemical solubility can be formed by virtue of the predetermined separation location being formed from a different material and/or by a different method in such a way that the predetermined separation location has a higher solubility with respect to a solvent, an acid or a base. In addition or instead, the predetermined separation location can be structured, for example have a cutout, cavities or perforations. As a result, that proportion of material which is removable in the predetermined separation location can be reduced.

The connection of a first body to a second body can be positively locking, force-locking and/or cohesive. The connections can be formed as releasable, i.e. reversible. In various configurations, a reversible, close connection can be realized for example as a screw connection, a clamping, a latching connection and/or by means of clips and/or holding pins. However, the connections can also be formed as non-releasable, i.e. irreversible. In this case, a non-releasable connection can be separated only by means of the connection means being destroyed. In various configurations, an irreversible, close connection can be realized for example as a riveted connection, an adhesively bonded connection or a solvent connection.

In the case of a cohesive connection, the first body can be connected to the second body by means of atomic and/or molecular forces. Cohesive connections can often be non-releasable connections. In various configurations, a cohesive connection can be realized for example as an adhesively bonded connection, a soldered connection, for example of a glass solder or of a metal solder, or as a welded connection. The cohesive connection can be for example an electrically conductive adhesive bond (anisotropic conductive film bonding—ACF). The cohesive connection can be effected by means of a friction welding process (ultrasonic bonding—US bonding), curing with UV radiation or drying of a liquid cohesive connection means.

A barrier layer can be understood to mean a layer or a layer structure which is suitable for forming a barrier with respect to chemical impurities and/or atmospheric substances, for example with respect to water (moisture) and oxygen. In other words the first barrier layer 104 is formed in such a way that substances which can damage the optoelectronic component, for example water, oxygen or solvent, cannot penetrate through said first barrier layer or at most very small proportions of said substances can penetrate through said barrier layer. The barrier layer can be formed as an individual layer, a layer stack or a layer structure. In the case of a barrier layer formed as a layer stack, the barrier layer has a plurality of partial layers formed on top of another. In the case of a barrier layer formed as a layer structure, the barrier layer has a plurality of partial layers which are formed one on top of the another, wherein the partial layers can be laterally structured.

FIG. 1 shows a schematic cross-sectional view of an electronic component arrangement including a planar structure in accordance with various embodiments.

embodiments of an electronic component arrangement 100 are described in greater detail below on the basis of the example of an optoelectronic component 130 on a carrier 102 with a planar structure 128.

An optoelectronic component may include a hermetically impermeable substrate, an electrically active region 106 and an encapsulation structure.

The hermetically impermeable substrate may include the carrier 102 and a first barrier layer 104.

The electrically active region 106 may include a first electrode 110, an organic functional layer structure 112 and a second electrode 114.

The organic functional layer structure 112 may include a first organic functional layer structure unit 116, an intermediate layer 118 and a second organic functional layer structure unit 120.

The encapsulation structure may include a second barrier layer 108, an adhesive layer 122 and a cover 124.

The optoelectronic component 130 can be designed for taking up and/or providing electromagnetic radiation in such a way that an electrical energy is generated from an electromagnetic radiation taken up and/or an electromagnetic radiation is generated from an electrical energy provided.

The optoelectronic component 130 can be formed as an organic light emitting diode 130, an organic photodetector 130 or an organic solar cell.

An organic light emitting diode 130 can be formed as a so-called top emitter or bottom emitter.

A top emitter and/or a bottom emitter can also be formed as optically transparent or optically translucent.

The carrier 102 may include or be formed from glass, quartz, and/or a semiconductor material or any suitable material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 102 may include or be formed from a metal, for example copper, silver, gold, platinum, iron, for example a metal compound, for example steel.

The carrier 102 can be embodied as translucent or even transparent.

The carrier 102 can have a mechanically rigid region and/or a mechanically flexible region or be formed in this way.

In one embodiment, the carrier 102 can be formed as a waveguide for electromagnetic radiation of the optoelectronic component 130, for example can be transparent or translucent with respect to the provided electromagnetic radiation of the optoelectronic component 130.

The first barrier layer 104 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 104 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 104 including a plurality of partial layers, all the partial layers can be formed by means of an atomic layer deposition method. A layer sequence including only ALD layers can also be designated as a "nanolaminate".

In the case of a first barrier layer 104 including a plurality of partial layers, one or a plurality of partial layers of the second barrier layer 108 can be deposited by means of a different deposition method than an atomic layer deposition method, for example by means of a vapor deposition method.

The first barrier layer 104 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 104 may include one or a plurality of high refractive index materials, for example one or a plurality of materials having a high refractive index, for example having a refractive index of at least two.

Furthermore, it should be pointed out that, in various embodiments, a first barrier layer 104 can also be entirely dispensed with, for example for the case where the carrier 102 is formed in a hermetically impermeable fashion.

The electrically active region 106 can be understood as that region of the optoelectronic component 130 in which an electric current for the operation of the optoelectronic component 130 flows.

The first electrode 110 can be formed from an electrically conductive material, for example from a metal, a transparent conductive oxide (TCO), networks composed of metallic nanowires and nanoparticles, for example composed of Ag; networks composed of carbon nanotubes; graphene particles and graphene layers; networks composed of semiconductor nanowires; an electrically conductive polymer or transition metal oxides or a layer stack of a plurality of layers of the same metal or of different metals and/or of the same TCO or of different TCOs.

The first electrode 110 as metal may include one of the following materials: Ag, Pt, Au, Mg, Al, Ba, In, Ca, Sm or Li, and compounds, combinations or alloys of these materials.

The first electrode 110 may include as transparent conductive oxide one of the following materials: for example metal oxides: for example zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 110 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 110 can have a layer thickness of less than or equal to approximately 25 nm, for example a layer thickness of less than or equal to approximately 20 nm, for example a layer thickness of less than or equal to approximately 18 nm. Furthermore, the first electrode 110 can have for example a layer thickness of greater than or equal to approximately 10 nm, for example a layer thickness of greater than or equal to approximately 15 mm, for example a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 110 is formed from a transparent conductive oxide (TCO), the first electrode 110 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Moreover, the first electrode 110 may include or be formed from one of the following structures: a network composed of metallic nanowires, for example composed of Ag, which are combined with conductive polymers; a network composed of carbon nanotubes which are combined with conductive polymers; or graphene layers and composites. In these cases, the first electrode 110 can have a layer thickness in a range of approximately 1 nm to approximately 500 nm, for example a layer thickness in a range of approximately 10 nm to approximately 400 nm, for example a layer thickness in a range from approximately 40 nm to approximately 250 nm.

The first electrode 110 can be formed as an anode, that is to say as a hole-injecting electrode, or as a cathode, that is to say as an electron-injecting electrode.

The first electrode 110 can have a first electrical terminal, to which a first electrical potential can be applied. The first electrical potential can be provided by an energy source (not shown), for example a current source or a voltage source. Alternatively, the first electrical potential can be applied to an electrically conductive carrier 102 and the first electrode 110 can be electrically supplied indirectly through the carrier 102. The first electrical potential can be for example the ground potential or some other predefined reference potential.

FIG. 1 illustrates an optoelectronic component 130 including a first organic functional layer structure unit 116 and a second organic functional layer structure unit 120. In various embodiments, however, the organic functional layer structure 112 can also include one or more than two organic functional layer structures, for example 3, 4, 5, 6, 7, 8, 9, 10, or even more, for example 15 or more, for example 70.

The first organic functional layer structure unit 116 and the optionally further organic functional layer structures can be formed identically or differently, for example include an identical or different emitter material. The second organic functional layer structure unit 120, or the further organic functional layer structure units can be formed like one of the below-described configurations of the first organic functional layer structure unit 116.

The first organic functional layer structure unit 116 may include a hole injection layer, a hole transport layer, an emitter layer, an electron transport layer and an electron injection layer.

In an organic functional layer structure unit 112, one or a plurality of the layers mentioned can be provided, wherein identical layers can have a physical contact, can be only electrically connected to one another or can even be formed in a manner electrically insulated from one another, for example can be arranged alongside one another. Individual layers of the layers mentioned can be optional.

A hole injection layer can be formed on or above the first electrode 110. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9,9-bis[4-(N,N-bisnaphthalen-2-yl-amino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino)-9,9-spirobifluorene; 2,2'-bis[N,N-bis(biphenyl-4-yl)amino]9,9-spirobifluorene; 2,2'-bis(N,N-diphenylamino)9,9-spirobifluorene; di-[4-(N,N-ditolyl-amino)phenyl]cyclohexane; 2,2',7,7'-tetra(N,N-di-tolyl)aminospirobifluorene; and/or N,N,N',N'-tetra-naphthalen-2-yl-benzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); Spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9,9-bis[4-(N,N'-bisnaphthalen-2-ylamino)phenyl]-9H-fluorene; 9,9-bis[4-(N,N'-bisnaphthalen-2-yl-N—N'-bisphenylamino)-phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]9,9-spirobifluorene; 2,2'-bis(N,N-diphenylamino)9,9-spirobifluorene; di-[4-(N,N-ditolylamino)phenyl]cyclohexane; 2,2',7,7'-tetra(N,N-ditolyl)aminospirobifluorene; and N,N,N',N'-tetranaphthalen-2-yl-benzidine.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer.

Each of the organic functional layer structure units 116, 120 may include in each case one or a plurality of emitter layers, for example including fluorescent and/or phosphorescent emitters.

The organic functional layer structure units 116, 120 can generally include one or a plurality of electroluminescent layer(s) and/or one or a plurality of photoluminescent layer(s).

The one or the plurality of electroluminescent layers may include organic polymers, organic oligomers, organic monomers, organic small, non-polymer molecules ("small molecules") or a combination of these materials.

The optoelectronic component 130 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru (dtb-bpy)*2(PF$_6$) (tris[4,4'-di-tert-butyl-(2,2')-bipyridine]ruthenium(III) complex) and blue fluorescent DPAVBi (4,4-bis[4-(di-p-tolyl-amino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited for example by means of a wet-chemical method, such as, for example, a spincoating method. The emitter materials can be embedded in a suitable manner in a matrix material, for example a technical ceramic or a polymer, for example an epoxy; or a silicone.

In various embodiments, the first emitter layer can have a layer thickness in a range of approximately 5 nm to approximately 50 nm, for example in a range of approximately 10 nm to approximately 30 nm, for example approximately 20 nm.

The emitter materials can be selected for example in such a way that the optoelectronic component 130 emits white light. The emitter layer(s) may include a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

Moreover, the emitter materials of different organic functional layer structure units 116, 120 can be chosen in such a way that although the individual emitter materials emit light of different colors (for example blue, green or red or arbitrary other color combinations, for example arbitrary other complementary color combinations), for example the overall light which is emitted overall by all the organic functional layer structures and is emitted toward the outside by the OLED is light of a predefined color, for example white light.

The organic functional layer structure unit 116 may include one or a plurality of electroluminescent layers embodied as hole transport layer, such that an effective hole injection into an electroluminescent layer or an electroluminescent region is made possible for example in that case.

By way of example, tertiary amines, carbazole derivatives, conductive polyaniline or polyethylene dioxythiophene can be used as material for the hole transport layer.

Furthermore, the organic functional layer structure unit 116 may include one or a plurality of emitter layers embodied as electron transport layer, such that for example an effective electron injection into an electroluminescent layer or an electroluminescent region is made possible.

Furthermore, an electron transport layer can be formed, for example deposited, on or above the emitter layer.

The electron transport layer may include or be formed from one or a plurality of the following materials: NET-18; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethyl-fluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-naphthalen-2-yl)phenyl)-1H-imidazo[4,5-f] [1,10] phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials: NDN-26, MgAg, $Cs_2CO_3$, $Cs_3PO_4$, Na, Ca, K, Mg, Cs, Li, LiF; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis [2-(2,2'-biypridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quino-linolate)-4-(phenylphenolato)aluminum; 6,6'-bis(5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl] benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridine-3-yl)phenyl)borane; 1-methyl-2-(4-(naphthalen-2-yl)phenyl)-1H-imidazo[4,5-f] [1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 112 including two or more organic functional layer structure units 116, 120, the second organic functional layer structure unit 120 can be formed above or alongside the first functional layer structure units 116. An intermediate layer 118 can be formed electrically between the organic functional layer structure units 116, 120.

In various embodiments, the intermediate layer 118 can be formed as an intermediate electrode 118 in accordance with one of the configurations of the first electrode 110. An intermediate electrode 118 can be electrically connected to an external voltage source. The external voltage source can provide a third electrical potential, for example at the intermediate electrode 118. However, the intermediate electrode 118 can also have no external electrical connection, for example by the intermediate electrode having a floating electrical potential.

In various embodiments, the intermediate layer 118 can be formed as a charge generating layer structure 118 (charge generation layer CGL). A charge generating layer structure 118 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 118 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 118 can furthermore have an intermediate layer structure between adjacent layers, which for example acts as a diffusion barrier.

In embodiments in which more than two organic functional layer structures are provided, a respective charge generating layer structure can be provided between in each case two organic functional layer structures.

Each organic functional layer structure unit 116, 120 can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm.

The optoelectronic component 130 can optionally include further organic functional layers, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 130.

The second electrode 114 can be formed on or above the organic functional layer structure 112 or, if appropriate, on or above the one or the plurality of further organic functional layers.

The second electrode 114 can be formed in accordance with one of the configurations of the first electrode 110, wherein the first electrode 110 and the second electrode 114 can be formed identically or differently. In various embodiments, metals are particularly suitable.

The second electrode 114 can be formed as an anode, that is to say as a hole-injecting electrode, or as a cathode, that is to say as an electron-injecting electrode.

The second electrode 114 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential.

The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second barrier layer 108 can also be referred to as thin film encapsulation (TFE). The second barrier layer 108 can be formed in accordance with one of the configurations of the first barrier layer 104.

Furthermore, it should be pointed out that, in various embodiments, a second barrier layer 108 can also be entirely dispensed with. In such a configuration, the optoelectronic component 130 may include for example a further encapsulation structure, as a result of which a second barrier layer 108 can become optional, for example a cover 124, for example a cavity glass encapsulation or metallic encapsulation.

Furthermore, in various embodiments, in addition, one or a plurality of coupling-in/-out layers can also be formed in the optoelectronic component 130, for example an external coupling-out film on or above the carrier 102 or an internal coupling-out layer (not illustrated) in the layer cross section of the optoelectronic component 130. The coupling-in/-out layer may include a matrix and scattering centers distributed therein, wherein the average refractive index of the coupling-in/-out layer is greater than the average refractive index of the layer from which the electromagnetic radiation is provided. Furthermore, in various embodiments, in addition, one or a plurality of antireflection layers (for example combined with the second barrier layer 108) can be provided in the optoelectronic component 130.

In various embodiments, a layer composed of an adhesive 122, can be provided on or above the second barrier layer 108 by means of which adhesive, a cover 124 is closely connected, for example adhesively bonded, on the second barrier layer 108.

The layer composed of adhesive 122 can be formed as transparent or translucent.

A layer composed of a transparent adhesive 122 may include for example particles which scatter electromagnetic radiation, for example light-scattering particles. As a result, the layer composed of adhesive 122 can act as a scattering layer and lead to an improvement in the color angle distortion and the coupling-out efficiency.

The light-scattering particles provided can be dielectric scattering particles, for example, composed of a metal oxide, for example, silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the layer composed of adhesive 122 and/or the protective laquer 122, for example air bubbles, acrylate, or hollow glass beads.

Furthermore, by way of example, metallic nanoparticles, metals such as gold, silver, iron nanoparticles, or the like can be provided as light-scattering particles.

The layer composed of adhesive 122 can have a layer thickness of greater than 1 µm, for example a layer thickness of a plurality of µm. In various embodiments, the adhesive may include or be a lamination adhesive.

The layer composed of adhesive 122 can be designed in such a way that it has a refractive index that is less than the refractive index of the cover 124. Such an adhesive can be for example a low refractive index adhesive such as, for example, an acrylate having a refractive index of approximately 1.3. However, an adhesive 122 can also be a high refractive index adhesive which for example includes high refractive index, non-scattering particles and has a layer-thickness-averaged refractive index that approximately corresponds to the average refractive index of the organic functional layer structure 112, for example in a range of approximately 1.7 to approximately 2.0.

Furthermore, a plurality of different adhesives can be provided which form an adhesive layer sequence.

In various embodiments, between the second electrode 114 and the layer composed of adhesive 122, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

Furthermore, it should be pointed out that, in various embodiments, an adhesive 122 can also be completely dispensed with, for example in configurations in which the cover 124 is applied to the second barrier layer 108, for example a cover 124 composed of glass which is formed by means of plasma spraying.

Furthermore, a so-called getter layer or getter structure, i.e. a laterally structured getter layer, can be arranged (not illustrated) on or above the electrically active region 106.

The getter layer may include or be formed from a material that absorbs and binds substances that are harmful to the electrically active region 106. A getter layer may include or be formed from a zeolite derivative, for example. The getter layer can be formed as translucent, transparent or opaque. The getter layer can have a layer thickness of greater than approximately 1 µm, for example a layer thickness of a plurality of µm.

In various embodiments, the getter layer may include a lamination adhesive or be embedded in the layer composed of adhesive 122.

A cover 124 can be formed on or above the layer composed of adhesive 122. The cover 124 can be closely connected to the electrically active region 106 by means of the layer composed of adhesive 122 and can protect said region from harmful substances. The cover 124 can be for example a glass cover 124, a metal film cover 124 or a sealed plastics film cover 124. The glass cover 124 can be closely connected to the second barrier layer 108 or the electrically active region 106 for example by means of frit bonding (glass soldering/seal glass bonding) by means of a conventional glass solder in the geometric edge regions of the organic optoelectronic component 130.

The cover 124 and/or the layer composed of adhesive 122 can have a refractive index (for example at a wavelength of 633 nm) of 1.55.

A planar structure 128 includes at least one planar structure 128 which is formed on or above the carrier 102. A planar structure 128 above the carrier 102 can be formed for example on the cover 124.

A planar structure 128 may include two or more planar structures. A planar structure 128 may include for example a first planar structure and a second planar structure.

The carrier 102, the cover 124, the electrically active region 106 and/or the optoelectronic component 130 can be formed between a first planar structure and a second planar structure.

The planar structure 128 can be formed as an internal and/or an external coupling-out structure.

The planar structure 128 can be structured before, during or after the process of applying and/or forming it on or above the carrier.

In one configuration, the planar structure 128 can be applied or formed in one piece on or above the carrier.

In one configuration, the planar structure can be applied as a preliminary structure in the form of a solution, suspension, dispersion or paste on or above the carrier 102. The preliminary structure can be applied for example in a structured manner, for example by means of a mask process. The preliminary structure can then be cured or crosslinked, for example to form a lacquer. As a result, the planar structure 128 can be formed on or above the carrier 102.

In one configuration, the planar structure 128 is structured during application or is structured by means of structured application. By way of example, a planar structure 128 in the form of a film can be structured, for example perforated, prior to application on or above the carrier 102. By way of example, a planar structure 128 in the form of a coating which is cured and/or crosslinked after application on or above the carrier can be formed in a structured manner or can be structured only after curing and/or crosslinking. The planar structure 128 can be structured after application, for example serially by means of a laser or a mask process, or during/after close connection, for example by purging non-crosslinked planar structure 128.

A planar structure 128 can be formed as a film or a crosslinked coating.

A planar structure 128 in the form of a film can be for example a plastics film, a metal film or a thin glass.

A planar structure 128 in the form of a plastics film may include one of the following materials: polyethylene naphthalate (PEN), polyethylene terephthalate (PET), polycarbonate (PC), polyimide (PI).

A planar structure 128 in the form of a metal film may include or be formed from one of the following materials: aluminum, copper, tin (tin foil) or alloys, for example steel, for example SUS.

A planar structure 128 in the form of a thin glass can be for example a soda-lime glass having a thickness of up to approximately 125 µm or include a thin glass coating, for example a glass-coating metal film or a glass-coated plastics film.

A planar structure 128 can be formed as a heat-conducting structure, for example as a heat-conducting film. A planar structure 128 as a heat-conducting structure may include a heat-conducting layer or be formed from a heat-conducting material. Heat-conducting can be understood to mean a structure which, as a product of its thickness d and its thermal conductivity k, has a value of greater than approximately 1000 µW/K, for example greater than approximately 5000 µW/K, for example greater than approximately 20 000 µW/K. The thickness of the layer can be for example less than approximately 10 mm, for example less than approximately 2 mm, for example less than approximately 100 µm. A heat-conducting structure may include for example a graphene layer, for example a graphene-coated film, for example an aluminum film, copper film or a film coated with aluminum or copper.

A planar structure 128 can be formed as a hermetically impermeable structure with respect to light and/or water, for example as a barrier film, for example in the form of a plastics film having a barrier layer or a metal film. The barrier layer of the planar structure can be formed for example in accordance with one of the configurations of the first barrier layer 104.

A planar structure 128 can be formed as a coupling-out film or coupling-in film, for example include light-scattering particles in accordance with one of the configurations of the adhesive layer 122.

A planar structure 128 can be formed as UV protection, for example by virtue of the planar structure 128 including or being formed from a UV-absorbing substance, for example one of the following substances: $TiO_2$, $CeO_2$, $Bi_2O_3$, ZnO, $SnO_2$ a phosphor, UV-absorbing glass particles and/or suitable UV-absorbing metallic nanoparticles, wherein the phosphor, the glass particles and/or the nanoparticles have an absorption of electromagnetic radiation in the UV range.

A planar structure 128 can be formed as anti-scratch protection, for example by virtue of the planar structure 128 having a greater hardness than the carrier 102, the cover 124 and/or the optoelectronic component 130.

A planar structure 128 can alter the color appearance of the optoelectronic component 130, for example by virtue of the planar structure 128 including a high-gloss coating and/or color pigments.

A planar structure 128 as a crosslinked coating can be formed from a plastic, for example, which is crosslinked and optionally structured after application to the optoelectronic component 130. In other words: the planar structure 128 may include a crosslinked polymer or a silicone.

A hermetically impermeable carrier and a planar structure 128 which include different materials form a so-called hybrid carrier 126. A hermetically impermeable carrier can be an intrinsically hermetically impermeable carrier, for example a carrier 102 composed of a metal, glass or a ceramic, or a carrier 102 having a first barrier layer 104.

Figure 2:
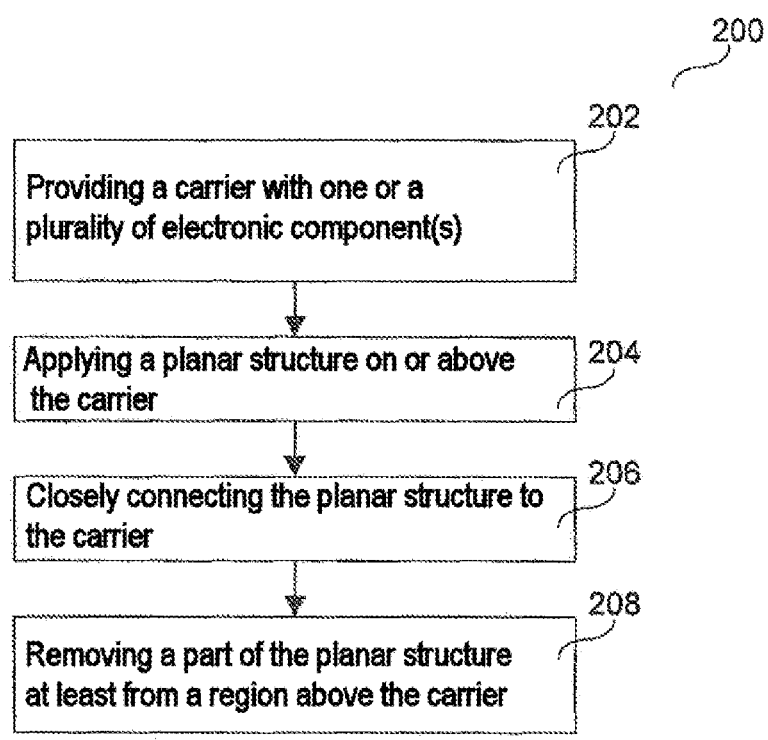
FIG. 2 shows a diagram for a method for processing an electronic component arrangement.

FIG. 2 shows a diagram for a method for processing an electronic component arrangement.

The method may include providing 202 a carrier with one electronic component or a plurality of electronic component units.

Providing may include for example forming an optoelectronic component in accordance with one of the configurations of the optoelectronic component 130 from the description of FIG. 1. Moreover, two or more identical or different electronic component units, for example optoelectronic components in accordance with one of the configurations of the optoelectronic component 130 in FIG. 1, can be formed alongside one another on or above a common carrier.

The method may include applying 204 a planar structure on the carrier or above the carrier. Applying 204 the planar structure may include applying a film or forming a crosslinkable planar coating.

A planar structure formed as a film can be for example a lamination film, for example a plastic, a plastics film, a coated plastics film, a metal film, a heat-conducting film.

The planar structure can be structured prior to application or can be structured after application. The structured planar structure may include for example predetermined separation locations, for example in the region of the contact region of an electronic component and/or in the region between two adjacent electronic component units.

Applying 204 the planar structure may include applying 204 a planar structure on that side of the carrier which faces away from the electronic component; or above the carrier on the side of the electronic component, i.e. on the electronic component.

Applying 204 the planar structure may include applying the planar structure on or above the carrier over the whole area.

However, applying 204 the planar structure can also include applying the planar structure on or above individual regions of the carrier.

The method may include closely connecting 206 the planar structure to the carrier.

Closely connecting 206 a planar structure formed as a film can be for example cohesive, for example laminating. Laminating can be for example by means of curing of a liquid adhesive or UV curing of a UV-curable adhesive.

Closely connecting the film to the carrier or an electronic component can be carried out in a structured manner, for example by the close connection means being applied and/or cured in a structured manner. Furthermore, different regions can be formed in the planar structure by means of different close connection means and/or different close connections. With a close connection means, for example, different close connections can be formed if the close connection means can be cured or crosslinked to different degrees. As a result, the close connection can have a different cohesion and/or adhesion in the structured regions of the planar structure. By way of example, that part of the planar structure which is to be removed can be closely connected to the carrier and/or the electronic component in such a way that the removable part has a lower adhesion to the carrier and/or the electronic component than that part of the planar structure which is intended to remain on the carrier and/or on the electronic component. For this purpose, by way of example, the different regions laminated films can be printed with adhesives having different adhesive strength, or be provided with adhesive only in the adhesion regions, in order that the films can be removed more easily in the regions which are intended subsequently to be removed.

Closely connecting 206 a planar structure formed as a crosslinkable coating can be for example crosslinking the coating.

The method may include removing 208 a part of the planar structure at least from a region above the carrier. That part of the planar structure which is to be removed can be removed above a region for which admission or access from outside is intended to be possible. By way of example, that part of the planar structure which is to be removed can be removed from the electronic component in which an electrical contact region is formed; from the carrier in which a singulation region is provided.

The contact region can be formed for contacting the electronic component with an external voltage source.

The singulation region can be arranged between two electronic component units for the purpose of singulating the electronic component units. Removing 208 a part of the planar structure may include separating or dissolving the predetermined separation locations.

Removing 208 a part of the planar structure can additionally include detaching a part of the planar structure from the carrier or the electronic component in one piece, for example pulling it off, for example in one process step.

In order to facilitate the process of removing 208 a part of the planar structure, that part of the planar structure which is to be removed may not be closely connected to the carrier or the electronic component during the process of closely connecting 206. For this purpose, no close connection may be formed between planar structure and carrier or electronic component in the region of that part of the planar structure which is to be removed, for example by virtue of the fact that in this region no adhesive is applied or the adhesive is not cured.

Furthermore, the method may include singulating the plurality of electronic component units and/or electrically contacting an electronic component. Singulating the plurality of electronic component units can be carried out in the region of the carrier on which the part of the planar structure was removed. This has the advantage that in the case of a carrier and a planar structure which are materially different, the singulation device need only be set up for severing the material of the carrier—since the planar structure has already been removed. For electrically contacting the electronic component, one advantage is that the contact regions are exposed in a defined manner.

FIGS. 3A-3F show schematic illustrations of optoelectronic component arrangements in the method for processing in accordance with various embodiments.

An electronic component 300 provided may include one electronic component 130 or a plurality of electronic component units 130 on a carrier 102. An electronic component 300 having a plurality of electronic component units 130n may include a plurality of identical or different electronic components, wherein n is an integer and the individual electronic component units are designated with consecutive numbering (illustrated in FIG. 3A: n=6).

An electronic component 130 or an electronic component unit 130n can be formed for example in accordance with one of the configurations from the descriptions of FIG. 1, for example as an organic light emitting diode, as an organic solar cell, as an organic photodetector, an organic light emitting cell (OLEC), a display. Furthermore, an electronic component 130 may include or be a microelectromechanical system (MEMS).

The electronic component 300 may include for example a plurality of light emitting organic light emitting diodes 130n designed as so-called bottom emitters. As carrier 102, the electronic component 300 may include a glass carrier, for example.

An electronic component 130 can be electrically connected to an external voltage source by means of electrical contact regions 302. The electrical contact regions 302 can be connected for example to the electrodes 110, 118, 114 of a configuration of the optoelectronic component 130 from the description of FIG. 1. An electronic component 130 may include two or more electrical contact regions 302, for example three contact regions 302 for a circuit which includes a transistor, thyristor or an optoelectronic component 130 in accordance with one configuration in FIG. 1 having three electrodes 110, 118 and 114.

A planar structure 128 can be applied or formed on the carrier 102 or above the carrier 102, i.e. on the electronic component 130, of the electronic component 300 provided. The planar structure 128 can be structured, for example have predetermined separation locations 304 (illustrated in FIG. 3B by means of the dashed lines 304).

In the abovementioned example of the organic light emitting diodes 130n on a glass carrier 102, the planar structure 128 can be formed for example as anti-scratch protection on the optically inactive rear side of the organic light emitting diodes 130n and protect the organic light emitting diode 130 against mechanical damage and ingress of moisture. The planar structure 128 as anti-scratch protection can be formed for example as an anti-scratch protection film, for example as a metal film, a plastics film or a barrier film. The planar structure 128 can be formed over the whole area on the second barrier layer 108 for example after the process of forming the second barrier layer 108 (see description of FIG. 1). By way of example, the planar structure 128 as anti-scratch protection film 128 can be laminated onto the second barrier layer 108.

In the anti-scratch protection film 128, provision can be made of predetermined separation locations 304 in the region of the electrical contact regions 302 of an organic light emitting diode 130n and/or in singulation regions between adjacent light emitting diodes 130n, for example predetermined separation locations 304. The predetermined separation locations 304 can be chosen design-specifically, such that the anti-scratch protection film 128 can be divided by means of the perforation lines 304 into regions on the electrical contact regions 302 and regions of the light emitting region of the organic light emitting diode 130.

The planar structure 128 can be aligned with respect to the predetermined separation locations 304, if the latter have already been formed in the planar structure, and the electronic component units 130n and then be closely connected to the carrier 102 and/or the electronic component units (illustrated in FIG. 3C in such a way that the predetermined separation locations 128 are aligned between adjacent electronic component units 130n). An electronic component arrangement 310 is formed as a result.

In the example mentioned above, the lamination of the anti-scratch protection film 128 can be carried out over the whole area on the plane of the electronic component 300, i.e. at plate level.

In various embodiments, the predetermined separation locations 304 can be formed only after the planar structure 128 has been closely connected to the electronic component 300.

In the example mentioned above, after the anti-scratch protection film 128 has been laminated onto the organic light emitting diode 130, the predetermined separation locations 304 can be formed for example by means of a stamping method or laser structuring.

Afterward, a part 306 of the planar structure 128 can be removed from a region above the carrier 102, such that at least one part of the planar structure 128 remains above the carrier 102. The removed part 306 of the planar structure 128 can be removed, for example pulled off, for example in one piece (illustrated in FIG. 3D as shifted part of the planar structure 128). The removal of the part of the planar structure 128 can be made possible, for example, by virtue of the fact that the predetermined separation locations 304 were separated prior to the removal. The separation can be carried out for example by means of ballistic exposure, a mechanical force action or by means of chemical removal.

Ballistic exposure can be realized for example by means of a bombardment of the region to be exposed with particles, molecules, atoms, ions, electrons and/or photons. Bombardment with photons can be formed for example as a laser having a wavelength in a range of approximately 200 nm to approximately 1700 nm, for example in a focused manner, for example with a focus diameter in a range of approximately 10 µm to approximately 2000 µm, for example in a pulsed manner, for example with a pulse duration in a range of approximately 100 fs to approximately 0.5 ms, for example with a power of approximately 50 mW to approximately 1000 mW, for example with a power density of approximately 100 kW/cm$^2$ to approximately 10 GW/cm$^2$, and for example with a repetition rate in a range of approximately 100 Hz to approximately 1000 Hz.

A mechanical force action can be realized for example by means of a sharp-edged tool.

Chemical removal can be for example dissolving the predetermined separation locations using a solvent or etching the predetermined separation locations.

The electronic component arrangement 310 differs after the removal of a part 306 of the planar structure with respect to the provided electronic component 300 to the effect that a part of the planar structure 128 remains on the carrier 102 and/or on the electronic component.

In the example mentioned above, after lamination and separation of the predetermined separation locations 304 of the anti-scratch protection film 128, a part of the anti-scratch protection film 128 can be pulled off, for example from the contact areas 302 and/or the singulation regions 308. The anti-scratch protection films 128 on the rear side of the optically active region of the organic light emitting diode(s) 130 remain undamaged.

The removed part 306 of the planar structure 128 can expose for example a singulation region 308 (illustrated in FIG. 3E by means of the dash-dotted line) and/or a contact region (see FIGS. 5A-5F) of the electronic component 130 or of the electronic component units 130n.

By virtue of the fact that, for example, the singulation region 308 is free of planar structure 128, the singulation device 312 can be set up with respect to severing the material of the carrier 102. By means of the exposure of the singulation region 308, therefore, the wear of the singulation device 312 can be reduced and/or actually enable a singulation in the first place. A singulation device 312 can be or include a laser or a scribe wheel (illustrated in FIG. 3E), for example.

By means of the singulation of the electronic component units 130n, a plurality of electronic components 130 including a planar structure 128 are formed (illustrated in FIG. 3F by means of the electronic components 314 illustrated as separated). The singulation can be carried out for example by means of breaking or dicing the carrier 102 along the singulation region.

In the example mentioned above, the glass carrier 102 can be divided by means of a scribe wheel 308 in a scribe and break method, such that the electronic component arrangement 310 including a plurality of electronic component units 130n is divided into individual devices. This is possible for example even in the case of thick glass carriers 102. In the case of organic light emitting diodes 130 encapsulated with a glass cover (see description of FIG. 1), such glass carriers 102 can be divided by means of a scribe wheel only with difficulty or only with poor quality if a film is applied on one of the glasses.

Figure 4A:
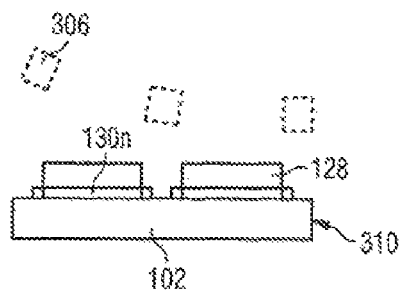
FIGS. 4A-4C show schematic illustrations of optoelectronic component arrangements in the method for processing in accordance with various embodiments.
Figure 4B:
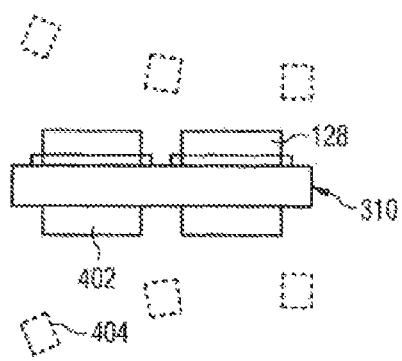
Figure 4C:
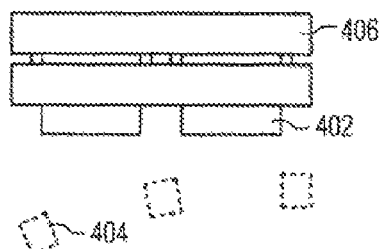

FIGS. 4A-4C show schematic illustrations of optoelectronic component arrangements in the method for processing in accordance with various embodiments.

In one embodiment, the planar structure 128 is formed as a film and is applied to the electronic component 130 above the carrier 102, wherein a part of the planar structure 128 is subsequently removed—illustrated in a side view in FIG. 4A by means of the part 306 of the planar structure 128 removed in one piece.

The planar structure 128 can be for example a plastics film, for example composed of PEN, PET, PC, PI, optionally with barrier layer; a metal film and/or a heat-conducting film; for example in accordance with one of the configurations mentioned above.

The carrier 102 can be or include a glass, for example a soda-lime glass, for example having a thickness of greater than approximately 1 mm, for example in accordance with one of the configurations mentioned above.

In the case of an electronic component unit 130n formed as an optoelectronic component 130, for example as a top emitter, the carrier 102 can be formed from a metal or include a metal. In order nevertheless to couple light into or out of the optoelectronic component, the planar structure 128 should be transparent or translucent.

The planar structure 128 can be applied on the carrier 102 or above the carrier 102 in a structured manner or over the whole area.

When applying or forming the planar structure 128 above the carrier 102, it is possible for the planar structure 128 to be applied or formed on the carrier 102 and/or on the electronic component 130.

The electronic component 130 can be an optoelectronic component 130 formed as a so-called bottom emitter, top emitter, or a transparent component. When processing an organic light emitting diode as a top emitter or transparent organic light emitting diode, the method can be employed for example when applying an anti-scratch protection film, a barrier film or a UV protection film, for example on an optically inactive side of the organic light emitting diode.

Moreover, on that side of the carrier 102 which faces away from the electronic component units 130n, a further planar structure can be applied on the carrier 102 (illustrated in FIG. 4B by means of the reference sign 402). The further planar structure can be applied to the carrier 102 in a structured manner or over the whole area. A part (illustrated in FIG. 4B by means of the reference sign 404) can be removed from the further planar structure 402 in order to expose a region that requires access from outside.

In addition to the abovementioned configurations of the planar structure 128, the further planar structure 402 can be formed as a coupling-out film 402, for example a plastics film in accordance with one of the abovementioned configurations with scattering particles, UV protection, anti-scratch protection and/or with a high-gloss coating.

In various embodiments, anti-scratch protection (identified in FIG. 4C by means of the reference sign 406) can be applied above the electronic component units 130n. The anti-scratch protection 406 can be for example a glass or a lacquer and have for example a greater hardness than the electronic component 130. The anti-scratch protection 406 can be formed for example in accordance with one of the configurations of the cover 124 (see description of FIG. 1).

Apart from the anti-scratch protection 406, in accordance with one of the abovementioned configurations, a further planar structure 402 can be applied on that side of the carrier 102 which faces away from the electronic component units 130n.

By means of the method 200, it is possible to singulate organic light emitting diodes 130n which include a glass carrier 102 and a glass cover 406 and in which scattering and/or UV films 402 have already been laminated on the light coupling-out side at plate level. In this regard, perforated scattering films 402 can already be laminated on the "light coupling-out side" at plate level, i.e. at the level of the electronic component 300. If, in the singulation regions (see description of FIGS. 3A-3F), the scattering films 402 are removed again prior to singulation, such electronic components 300 can be singulated by means of conventional scribe and break methods. Without the removal of the planar structure 402 from the singulation region, the carrier 102 with planar structure 402 could not be singulated. One reason for this, analogously to the illustration in the description of FIGS. 3A-3F, is that the planar structure 402 cannot be scribed.

FIGS. 5A-5F show schematic illustrations of optoelectronic component arrangements in the method for processing in accordance with various embodiments.

In various embodiments, by means of the method 200 for processing an electronic component, the electrical contact regions of an electronic component 130 can be exposed, for example on the optically inactive rear side of an electronic component 130.

Figure 5A:
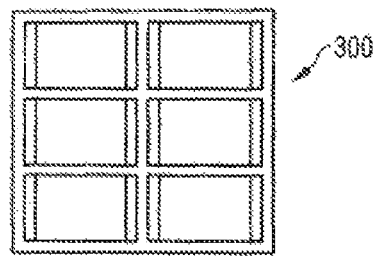
FIGS. 5A-5F show schematic illustrations of optoelectronic component arrangements in the method for processing in accordance with various embodiments.
Figure 5B:
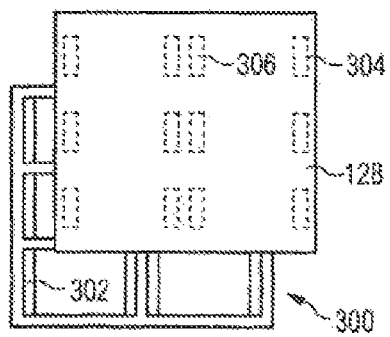
Figure 5C:
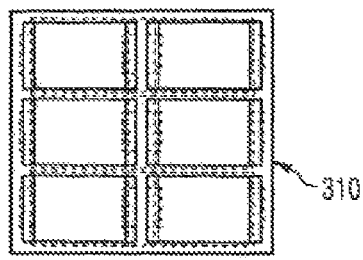

For this purpose, the electronic component 300 provided includes on a carrier one electronic component 130 or a plurality of electronic component units 130n—illustrated in FIG. 5A—as described in association with FIG. 3A. The planar structure 128 and the electronic component 300 can be formed in accordance with one of the configurations described above.

The electronic component 300 may include for example a plurality of light emitting organic light emitting diodes 130n designed as so-called bottom emitters. An organic light emitting diode 130 may include, on the optically inactive rear side, contact regions designed for electrically contacting the organic light emitting diode 130.

A planar structure 128 is applied or formed on the electronic component 300, in which planar structure predetermined separation locations 304 are formed. The planar structure 128 can be formed in such a way that the predetermined separation locations 304 surround a part of the planar structure that is to be removed (illustrated in FIG. 5B with the reference sign 306).

The planar structure 128 can be formed for example as anti-scratch protection on the optically inactive rear side of the organic light emitting diodes 130 and protect the organic light emitting diode against mechanical damage. The planar structure 128 as anti-scratch protection can be formed for example as an anti-scratch protection film. In the anti-scratch protection film, predetermined separation locations, for example perforation lines, can be provided in the region of the contact regions of an organic light emitting diode 130n.

The planar structure 128 can be formed or applied with respect to the structure and arrangement of the electronic component 130 or the electronic component units 130n and/or the contact regions 302. For this purpose, the planar structure 128 can be aligned or formed in such a way that the part 306 of the planar structure 128 that is to be removed is above the contact regions 302—illustrated in FIG. 5C by means of region 306 to be removed above the contact regions 302.

Figure 5D:
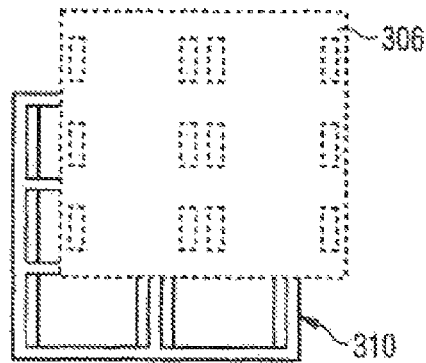

The part 306 of the planar structure 128 that is to be removed can be removed from the contact regions 302 of the electronic component 130 after separation of the predetermined separation locations 128 from the electronic component 300, for example in each case in one piece—illustrated in FIG. 5D by means of the regions 306 to be removed that are illustrated in a shifted fashion. The regions 306 to be removed can be removed from the electronic component 300 in one piece for example by means of a roll coated with adhesive.

Apart from removing the planar structure 128 above the contact regions 302, it is possible for the planar structure 128 optionally also to be removed from the singulation regions 308 (see description of FIGS. 3A-3F). In other words: the singulation of the carrier and of the planar structure can be carried out in each case at the same location.

Figure 5E:
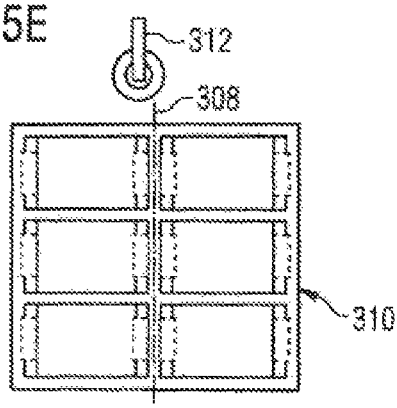

In some cases, it may be possible for the electronic component units 130n to be singulated without the removal of the planar structure 128 from the singulation region 308 from the carrier 102 (illustrated in FIG. 5E with planar structure 128 above the singulation region 308). This may be the case, for example, if the planar structure 128 and the carrier 102 have approximately similar chemical properties and/or physical properties with respect to the singulation method. In other words: the planar structure 128 and the carrier 102 can be formed in such a way that they can be severed simultaneously, such that removal of the planar structure 128 from the singulation region 308 becomes optional. The singulation can be carried out in accordance with a configuration mentioned above.

Figure 5F:
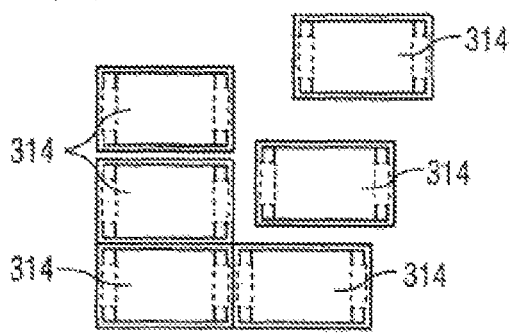

After the singulation of the electronic component units 130n, singulated electronic components with exposed contact regions are formed (illustrated in FIG. 5F by means of separated electronic components 314). The singulation can be carried out in accordance with a configuration mentioned above).

In various embodiments, a method for processing an electronic component and an electronic component arrangement are provided which make it possible to singulate hybrid carriers of electronic components, for example of an organic light emitting diode, in a simple manner and with conventional/existing methods. Furthermore, it is thereby possible to expose contact areas on hybrid carriers of electronic components more simply. Furthermore, it is thereby possible to singulate optoelectronic components which include a glass substrate and a cover glass and in which a coupling-in/-out scattering film has already been applied over the whole area on the front side at plate level, for example in the case of OLEDs.

As a result, by means of standard singulation methods, it is possible to singulate hybrid OLEDs in which substrate and rear-side technology consist of different materials, which could not be singulated at all by means of scribe and break on the basis of scribe techniques. In comparison with laser separation methods, for example the substrate and for example the film on the rear side of the substrate can thus be singulated selectively at the desired locations, such that the contact areas of an OLED are not damaged during the removal of the film from the rear side of the substrate.

In OLEDs in which scattering films for increasing the proportion of coupled-out light are laminated onto the OLED, the scattering film can already be laminated at plate level instead of at individual device level as hitherto. With regard to industrialization and automation of the production of OLEDs, a significant reduction of costs can be achieved as a result.

Furthermore, as a result, during the production of an OLED, the contact regions of the OLED can be exposed in a very simple manner. The singulation of the substrate of the OLED and of a film on the substrate can take place at the same location, as a result of which a laser singulation can be considered which is otherwise unsuitable owing to lack of selectivity.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for processing an electronic component, the method comprising:
    applying a planar structure provided with predetermined separation locations to the electronic component;
    removing a part of the applied planar structure, wherein removing comprises separating the planar structure at the predetermined separation locations; and
    wherein the electronic component comprises an electrical contact region,
    wherein the predetermined separation locations surround a part of the planar structure that is to be removed,
    wherein at least a part of the planar structure that is to be removed is above the contact region, and
    wherein the removed part of the applied planar structure is removed from the electrical contact region.

2. The method as claimed in claim 1,
    wherein the planar structure is formed in a flexible fashion.

3. The method as claimed in claim 1,
    wherein the planar structure comprises or is a film.

4. The method as claimed in-claim 1,
    wherein the electronic component comprises an optoelectronic component.

5. The method as claimed in claim 1,
    wherein removing further comprises pulling off the part to be removed of the applied planar structure from the electronic component.

6. The method as claimed in claim 1,
    wherein the electronic component is formed on a carrier, wherein a planar structure is applied on or above the electronic component, and/or wherein a planar structure is applied on or above that side of the carrier which faces away from the electronic component.

7. The method as claimed in-claim 1,
    wherein the electronic component comprises two or more electronic component units,
    wherein the planar structure is applied on or above the two or more electronic component units.

8. The method as claimed in claim 7,
    wherein at least one predetermined separation location is formed between two electronic component units.

9. The method as claimed in claim 1,
    wherein applying the planar structure comprises cohesively connecting the planar structure to the electronic component.

10. The method as claimed in claim 9,
wherein the means for forming the cohesive connection is applied in a structured fashion on or above the electronic component and/or the planar structure or is structured after the applying process.

11. The method as claimed in claim 9,
wherein the means for forming the cohesive connection has a lower adhesion and/or cohesion between the part to be removed of the planar structure and the electronic component compared with in the region between the planar structure not to be removed and the electronic component.

12. The method as claimed in claim 9,
wherein the region between the part to be removed of the planar structure and the electronic component remains free of cohesive connection means.

13. An electronic component arrangement, comprising:
an electronic component on a carrier; and
a planar structure,
wherein the planar structure comprises a planar structure on the carrier and/or a
planar structure on the electronic component,
wherein the planar structure comprises predetermined separation locations,
wherein the planar structure is formed in such a way that a part of the planar structure is removable from the electronic component arrangement after a process of separating the predetermined separation locations; and
wherein the electronic component comprises an electrical contact region,
wherein the predetermined separation locations surround a part of the planar structure that is to be removed,
wherein at least a part of the planar structure that is to be removed is above the contact region, and
wherein the removed part of the applied planar structure is removed from the electrical contact region.

14. The electronic component arrangement as claimed in claim 13,
wherein the electronic component comprises two or more electronic component units,
wherein the planar structure is formed on or above the two or more electronic component units, and wherein at least one predetermined separation location is formed between two electronic component units.

* * * * *